United States Patent [19]
Rona

[11] Patent Number: 5,350,940
[45] Date of Patent: Sep. 27, 1994

[54] ENHANCED MOBILITY METAL OXIDE SEMICONDUCTOR DEVICES

[75] Inventor: Mehmet Rona, Belmont, Mass.

[73] Assignee: Fastran, Inc., Boston, Mass.

[21] Appl. No.: 804,334

[22] Filed: Dec. 6, 1991

Related U.S. Application Data

[63] Continuation of Ser. No. 492,700, Mar. 13, 1990, abandoned, which is a continuation of Ser. No. 62,002, Jun. 12, 1987, abandoned, which is a continuation of Ser. No. 576,345, Feb. 2, 1984, abandoned.

[51] Int. Cl.$^5$ .............................................. H01L 29/72
[52] U.S. Cl. ...................... 257/402; 257/194; 257/656
[58] Field of Search ...................... 257/402, 656, 194

[56] References Cited

U.S. PATENT DOCUMENTS 4,242,691 12/1980 Kotani et al. ...................... 257/194
4,755,857 7/1988 Abstreiter et al. ................. 257/194

OTHER PUBLICATIONS

Nishizawa et al, IEEE J. of Solid State Circuits, vol. SC-15, No. 4, Aug. 1980, pp. 705-715.
Konaka et al, Proc. 10th Conference on Solid State Devices, Tokyo, 1978, Japan J. Applied Physics vol. 18, Suppl 18-1, 1979, pp. 27-33.

*Primary Examiner*—William D. Larkins
*Attorney, Agent, or Firm*—Edwin H. Paul; Jerry Cohen

[57] ABSTRACT

This invention relates to a process for fabricating a metal-oxide-semiconductor device and to the semiconductor device which has enhanced charge mobility due to the inclusion of a thin layer of intrinsic semiconductor which provides a "fast track" charge channel directly at the accumulated inversion layer. The particular semiconductor device described is the enhanced mobility metal-oxide-semiconductor field effect transistor EMMOSFET having the intrinsic layer from about 100 Å to about 1000 Å thick. The intrinsic layer provides a low resistivity channel between the source and drain of the EMMOSFET resulting in an increase in device speed and a decrease in device heat generation.

8 Claims, 5 Drawing Sheets

ENHANCED MOBILITY METAL OXIDE SEMICONDUCTOR DEVICES

This application is a continuation of application Ser. No. 492,700, filed Mar. 13, 1990 which is continuation of 062,002 filed Jun. 12, 1987, which is continuation of 576,345 filed Feb. 2, 1984, all now abandoned.

BACKGROUND OF THE INVENTION

This invention generally relates to metal oxide semiconductor field effect transistors (MOSFET), and in particular the present invention relates to an improvement applicable to the MOSFET structure in all of its currently known embodiments. Further this invention relates to the methods used to fabricate the improved MOSFET. The MOSFET which is the subject of this invention and referred to hereinafter as an enhanced mobility MOSFET or EMMOSFET, exhibits more rapid switching characteristics, higher band width, and lower heat generation.

The operation of the metal-oxide-field effect transistor requires the application of a voltage to a gate electrode situated parallel to the surface of a substrate and electrically isolated from it by an insulating oxide layer. If a p-type or alternatively an n-type substrate is used then electrons or alternatively holes are the minority carriers in the bulk of the silicon wafer. However, the application of a positive or alternatively a negative voltage causes the electrons or alternatively holes to be swept to the semiconductor surface directly under the gate electrode thus making them majority carriers in a thin (less than about 100 Å) layer. The thin layer of carriers (carriers refer to electrons or holes) is arranged to bridge the area between two electrical contacts called the "source" and "drain" and provide electrical conductivity in between the source and the drain.

The speed of a MOSFET is a measure of how fast the change of the gate voltage causes a change in the electrical current between the source and drain. Attempts have been made to increase the speed of MOSFETS since high speed is an important attribute for MOSFETS especially where they are used in digital circuits. Efforts to improve the speed of MOSFETS were mainly directed toward making the MOSFET smaller.

In the scaling down of the device size, all of the geometrical dimensions are reduced by a scaling factor (1/K) but at the same time the threshold and punch through voltage must be maintained which can be achieved by reducing the power supply voltage by K and increasing doping concentration by K. However, a reduction of the power supply voltage has been found to be unacceptable since the reduction of voltage would necessitate extensive hardware changes. Hence, the industry standard of 5 V for the power supply has been retained, and will probably be retained in the foreseeable future. The further scaling of the devices to smaller sizes will not yield an optimum set of device parameters when the devices are operated using the 5 V standard gate voltage. Nevertheless the reduction of the gate length from 3.5 micrometers ($\mu$m) to 2.0 $\mu$m has reduced access time from 35 nanoseconds(ns) to 15 ns. In other words the reduction in gate length has increased the device speed by a factor of more than two. Because of the need to further increase device speed, it would likely be difficult for industry to maintain the 5 V single-voltage standard for power supply voltage in IC manufacture if the efforts to increase speed were to continue along the lines of device size reduction.

There is a fundamental difficulty associated with gaining device speed by size reduction without an accompanied voltage reduction. When the source-drain voltage is kept fixed and the size reduced, the electric field between the source and the drain increases causing a velocity saturation with a consequential decrease in electron mobility and an increase in power or energy dissipation. Hence it is important to increase the speed of devices to the maximum possible extent without reverting to the scaling down of the device size so as to cause velocity saturation. Such an effort has the obvious advantage of enabling industry to stay with the 5 V power supply standard and consequently not have to change hardware external to the IC package., Also extensive retooling with new and expensive equipment for photolithographic processes suitable for smaller sizes will not be required. This invention provides a means to increase the device speed without further device size reduction thus allowing the continued use of the 5 V power supply and the currently accepted hardware and packaging. The printed circuit (PC) boards, connectors, etc. need not be changed. Further by keeping the device size and power supply voltage unchanged, it will not be necessary for industry to retool with new mask pattern generators and mask aligners, and other such production facilities. This invention, rather than decreasing the path length from source to drain, provides a means to increase the speed of travel of the carriers from source to drain.

SUMMARY OF THE INVENTION

The MOSFET structure can be fabricated both in an n-type and p-type silicon substrate wherein are diffused heavily doped "wells" which form the source and drain regions. The MOSFET operates by the creation, maintenance and the control of a thin but dense layer of electrons or holes where p-type substrate is used, under a gate electrode bridging the source and drain regions. This layer is separated by a region depleted of carriers from the bulk of the substrate where holes or alternatively electrons are the majority carriers in the silicon substrate. Even though doping of the substrate is necessary, the presence of charged ionized dopant atoms in the same region as the inversion layer causes scattering of carriers by the ionized impurity atoms thereby decreasing the speed of travel of the carriers between the source and drain contacts.

The invention described herein involves the design of the substrate so that on top of a p-type layer or n-type layer, a pure silicon layer about 100 Å to about 1000 Å thick is grown to allow the charge conduction through a region where there are no charged or uncharged impurities. The design also allows the separation of the inversion layer of charges and the nearest ionized impurity atoms by a distance of at least about 100 Å. This separation is important and needed to reduce the scattering effect of the impurity charges on the charges in the inversion layer.

Accordingly, a general object of the present invention is to provide a method to design and fabricate a MOSFET having enhanced carrier mobility. Over the planar surface of a doped substrate there is deposited an intrinsic or pure silicon layer which is about 100 Å to about 1000 Å thick which allows the current conduction to take place upon application of the appropriate voltages to the gate, source, and drain regions, through a region where there are very few charged or uncharged impurities.

A further object of the invention is to provide a method for fabricating an EMMOSFET having a separation of the inversion layer carriers and the nearest ionized impurity atoms by at least about a 100 Å distance. A still further object of the invention is to provide a method to fabricate an EMMOSFET which will dissipate less energy as compared to the conventional MOSFET in addition to having the other advantages indicated herein.

Yet another object of the present invention is to provide an EMMOSFET which has a speed of operation which is faster than the conventional MOSFET due in substantial part to the marked increase in the charge mobility in the inversion layer. The charge mobility is increased as a result of the intrinsic semiconductor layer disposed over and contiguous with the channel region planar surface of the doped bulk semiconductor.

Other objects of the invention will in part be obvious and will in part appear hereinafter. The invention accordingly comprises the device possessing the construction, combination of elements and arrangement of parts which are exemplified in the following detailed disclosure including a description of the process by which the device is fabricated. Other objects of the invention will further be obvious from a view toward the scope of the application.

DETAILED DESCRIPTION OF THE INVENTION

Figure 1:
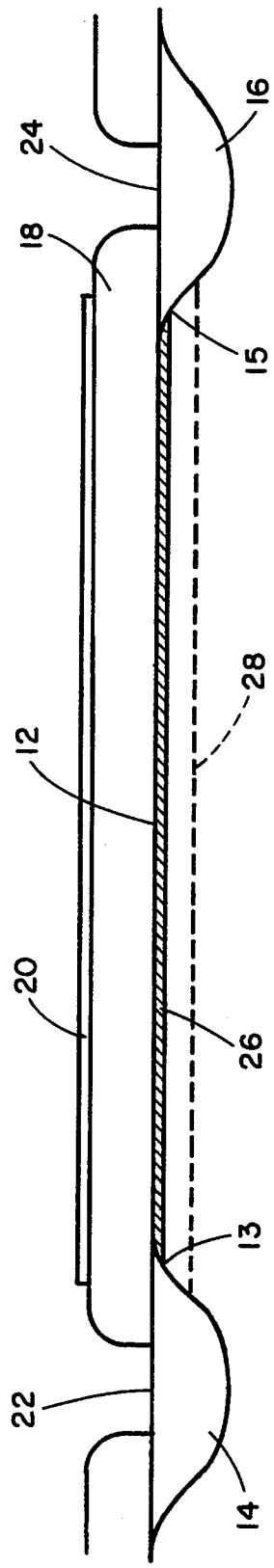
FIG. 1 is a cross-sectional view of a typical prior art silicon-based MOSFET.

In developing the theory and the discussion of the present invention, it is important to first understand the basic operation of a typical silicon MOSFET. With reference to FIG. 1 the substrate 10 is shown as a p-type semiconductive material. The source and drain regions 14 and 16 are in part formed by diffusing, for example, phosphorus into the surface 12 of the substrate so as to form two separate heavily doped n-type regions 14 and 16 in the surface 12. An electrically insulating layer is of, for example, silicon dioxide is formed on surface 12 of substrate 10 between regions 14 and 16. A thin layer of electrically conductive material such as a metal or polyslicon, is deposited on the oxide layer 18 to form the gate electrode 20 of the device. The same material forming layer 18 can also be used to form drain and source contact portions 22 and 24 respectively connected to the regions 14 and 16 as well known in the art.

A sufficiently high positive gate bias potential applied to the gate electrode 20 across layer 18 causes electrons to accumulate at the surface 12 of substrate 10 to form an inversion layer 26 which provides a current channel between the n-type source and drain regions 14 and 16. The gradual transition from the degenerate n-type inversion layer 26 to the non-degenerate p-type bulk defines the depletion layer 28. In this depletion layer region electrons and holes have densities which are roughly equal in orders of magnitude and the material is highly resistant to charge flow or current flow. It should be appreciated that layers 26 and 28 are defined by electron populations and are not physically separated materials as might be otherwise inferred by FIG. 1.

The collection of electrons in inversion layer 26 is approximately 100 Å thick for a sufficiently high positive voltage applied to gate electrode 20. Where the characteristic dimensions of the surface area over which the inversion layer is formed are much larger than a thickness dimension of 100 Å, this collection of electrons will behave basically as a two dimensional metal with an adjustable electron surface density the electron surface density $n_s$ is given in number of electrons per unit area.

Since the speed of current MOS devices is considerably less than the theoretical limits of the MOS devices, considerable effort has been expended in the past and will continue to be expended in the future, directed toward increasing the speed of these devices. Speed increases have come about as a result of: circuit innovations, use of new materials processed to obtain a higher mobility, new technologies directed to reducing stray capacitance such as dielectric isolation or silicon-on-sapphire, and methods for the control of or the increase of the surface mobility of currently used materials.

This invention is both a method for improving or enhancing the charge mobility of the MOSFET by decreasing or considerably limiting the scattering factors in the lattice structure of the substrate 10 and more particularly in the inversion layer 26, and a device having the enhanced mobility resulting from the methods of fabrication as described herein.

In order to still better understand the method and device of this invention it is necessary to discuss factors which impede motion of charge carriers in semiconductors.

A charge carrier in the conduction band of a perfect semiconductor at a temperature of absolute zero traverses the material with no scattering, and therefore, with a constant motion. The application of an external electric field will give rise to a constant rate of change of the speed of the charge carrier. A consequence of the complete lack of scattering is zero electrical resistance to the current flow through the semiconducting material. However, in reality even if the semiconducting material has a perfect crystalline structure, that is, no dislocations and no impurities, at any temperature other than absolute zero, atoms vibrate around their equilibrium positions and this vibrational motion causes electrons to scatter. This mechanism of vibration of the atoms dominates the scattering of electrons at room temperature.

Pure semiconductors have very few carriers at room temperature and therefore they have a high electrical resistivity. Since such materials have little practical use, an increase in the number of carriers is achieved by doping the bulk semiconductor with specific impurity atoms. By releasing one of their electrons or taking on the bound electrons of host atoms, these foreign of dopant atoms give rise to an increase in the concentration of the mobile charge carriers. However, by losing or gaining an electron these impurities become charged. The fixed charge on the impurity causes the mobile charge carriers to scatter. The contribution to the scattering of mobile charge carriers made by the charged impurities further increases the resistance to current flow. Thus some of the decrease of the resistance which is achieved by the doping process is lost by the very nature of the interaction of the carriers with the dopants.

In the MOSFET, the main current is carried by the inversion layer carriers. These carriers are generated in the bulk and the depletion layer and are swept to the surface under the influence of the gate voltage and form a high density slab of electronic charge collected so as to bridge the source and drain. The existence of such impurity atoms, in addition to not being necessary in order to decrease the resistance by the contribution of electrons, actually contribute to scatter and impede the motion of the electrons which are already there. In short they degrade the performance of the MOSFET without contributing any useful function.

Figure 2:
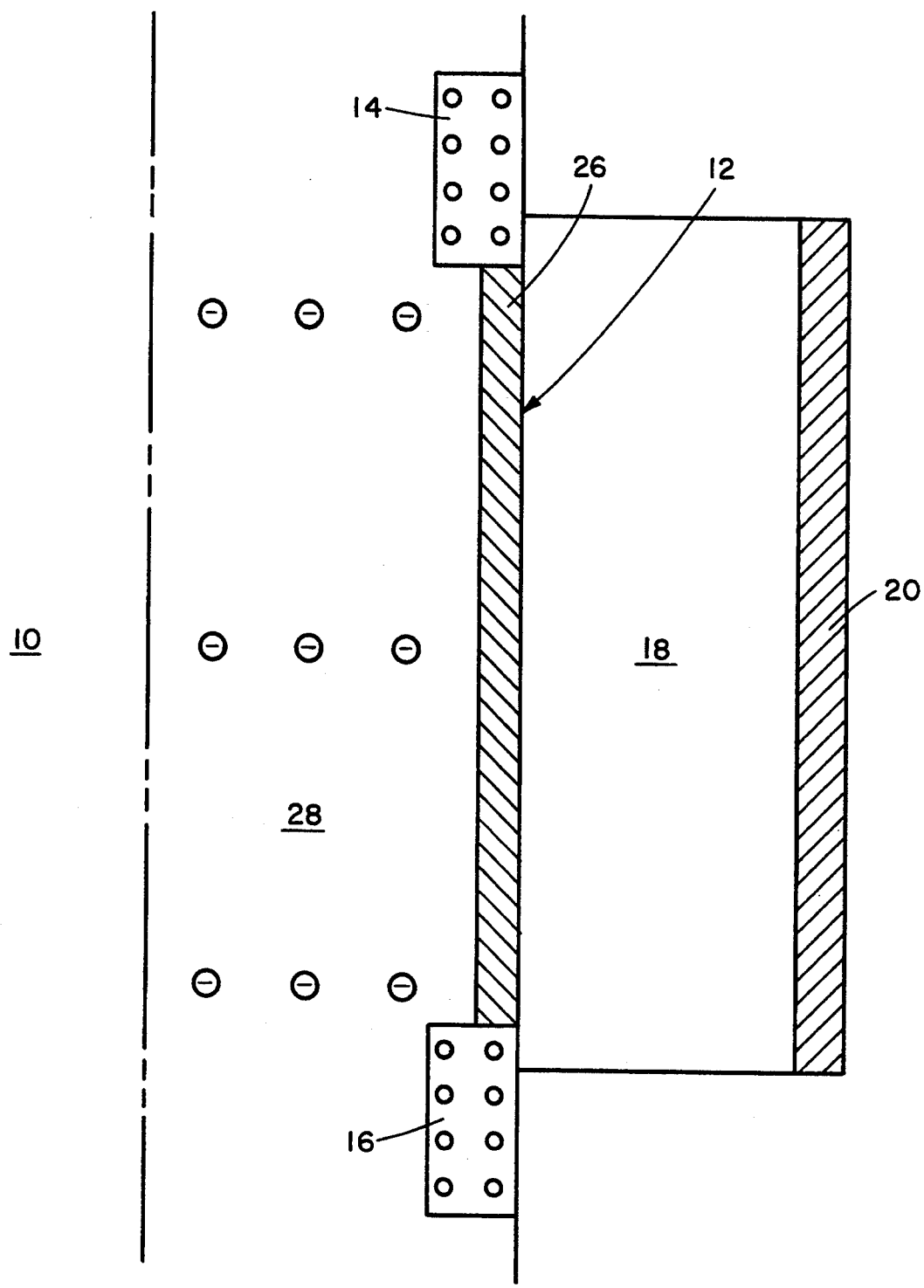
FIG. 2 is a geometric representation of the cross-section of a typical prior art silicon MOSFET.
Figure 5:
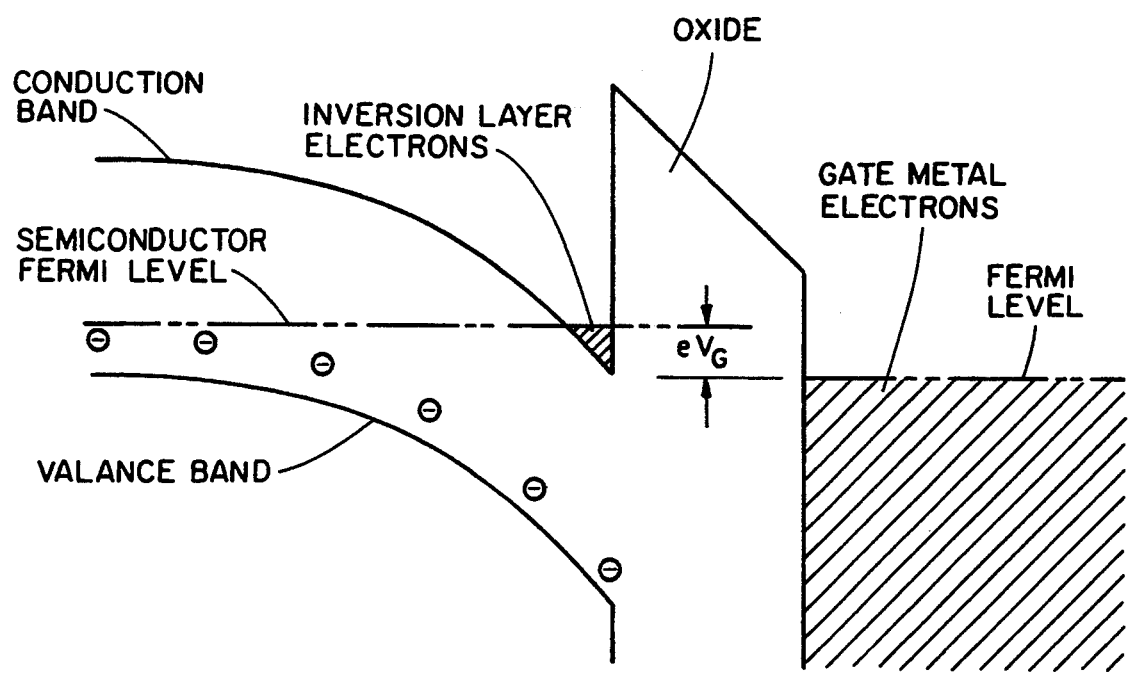
FIG. 5 is an energy-band diagram for a conventional prior art silicon base MOSFET.

For the sake of clarity one type of a MOSFET shall be discussed. The particular MOSFET to be used for purposes of discussion is one that is fabricated on a p-type semiconductor which will operate in the accumulation mode. FIG. 1 illustrates the basic geometry of such a MOSFET. FIG. 2 is a schematic representation of the prior art MOSFET. The application of a positive voltage on the gate electrode 20 attracts the electrons towards the gate electrode 20. Since the gate electrode 20 is not in direct contact with the semiconducting surface, because of the existence of an insulating layer 18 between the two, the electrons accumulate as a thin sheet on the surface 12 of the semiconductor when a sufficiently high positive voltage level is reached on the gate 20. Such a condition is as shown in FIG. 5. Even though electrons are minority carriers in the bulk of the p-type substrate 10, they become majority carriers at the surface 12 of the p-type substrate due to the high positive bias voltage applied to the gate 20. Between this thin sheet of electrons which is the inversion layer 26 and the p-type bulk 10, there is a gradual transition from the thin sheet 26, characterized as a degenerate n-type (metallic) surface, to the nondegenerate p-type (semiconducting) bulk. This gradual transition region is called the depletion layer or depletion region 28. This depletion layer 28 is an electrical insulator and in this region 28, electrons and holes are, in orders of magnitude of roughly equal density and the material is highly resistant to charge flow or current flow. Therefore, application of a sufficiently positive voltage ($V_{gs}$) to the gate electrode 20 will make the inversion layer 26 become highly conductive in nature (metallic) due to the high electronic density ($n_s \cong 10^{12} cm^{-2}$) on surface 12. Under these circumstances, a source-drain voltage ($V_{DS}$) would result in a high source-drain current ($I_D$) (see FIG. 3) where drain voltage ($V_D$) is positive with respect to the source voltage ($V_S$). A decrease of the gate voltage results in a decrease in the number of carrier electrons in the inversion layer 26, hence, a smaller amount of drain current $I_D$ flows as a response to an unchanging drain voltage.

Electrical current is directly proportional to the number of mobile charge carriers and to their mobility. Mobility is a measure of the speed attained by a charge carrier under the application of an external electric field. The electric field is calculated by the voltage difference applied across and the distance between two points. In other words, the voltage difference alone does not determine the strength of the electric field. It is important to know the distance of separation of the two points across which a potential difference is applied. For a given potential difference between two points, the force on an electron located in between the two points is inversely proportional to the distance between these points.

The greater the electrical force is on an electron, the greater is the average speed it attains under the action of that force until velocity saturation is reached. The "speed" of a MOSFET transistor is the rapidity with which a change in the gate voltage is reflected in the source-drain current I. A change in the gate voltage gives rise to a corresponding change in the electron density under the gate 20 and on the surface 12 of substrate 10. This change is picked up by source-drain circuit when the changed signal arrives at the drain contact portion 24. This means that when one increases the speed with which the charge carriers carry the source-drain current, there is a direct increase in the "speed" of MOSFET transistor.

As one increases the electric field which exerts a force upon a charge carrier, the average or steady speed achieved by the charge carrier increases proportionately. However, a "saturation" is reached such that a further increased voltage no longer causes a proportional increase of the speed of the charge carrier. Once velocity saturation is reached further increases in the electric field intensity only causes an increase in heat which must then be dissipated by the semiconductor material. This means that the increasing thermal dissipation effects caused by the increased voltage must be dissipated by the semiconductor medium. It is therefore not desirable to make devices smaller and smaller while continuing to apply the customary external 5 V potential difference for to use this approach, in effect, increases the electric field to the point of velocity saturation, and causes more energy to be dissipated within the device with no further increase in device speed. By making electrons more mobile, they can be made to traverse a distance faster with no change in either the component sizes or the industry standard supply voltage.

Figure 3:
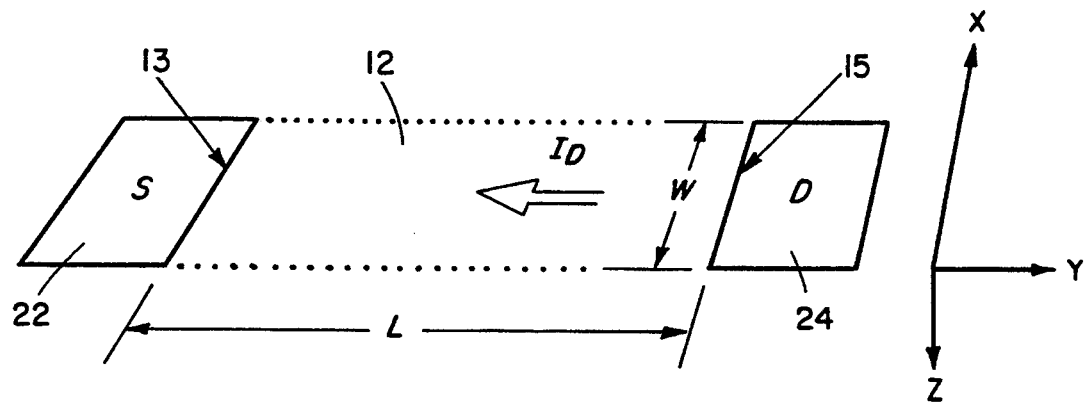
FIG. 3 is a geometric three dimensional representation of the channel of a typical MOSFET.

FIG. 3 illustrates the surface geometry of the channel or inversion layer 26. For the purpose of analysis the inversion layer 26 is assumed to be essentially zero in thickness (Z dimension) and the channel surface 12 has an area of length L times width W. The length L is the distance measured between the boundaries 13 and 15 of the channel surface 12 formed by the two spaced apart n-type regions 14 and 16. The essentially zero thickness layer 26 therefore, constitutes the surface 12 and this surface 12 has a surface conductivity as a function of the dimension y i.e., $\sigma(y)$. The incremental surface resistivity of the elemental material of width w and incremental length dy is given by the equation:

$$dR(y) = \frac{1}{\sigma(y)} \frac{dy}{W} \quad (1)$$

And therefore the incremental voltage in the y direction is:

$$dV(y) = I_D \frac{dy}{\sigma(y)W} \quad (2)$$

where $\sigma(y) = Q_s(y)\mu_s$. $Q_s(y) = en_s$ is the surface 12 charge density of channel 26 electrons at a position y measured in coulombs per square meter ($Q_s < 0$ where the charge carriers are electrons). Also $\mu_s$ is the mobility of the surface 12 electrons measured in meters$^2$/volt-second. It is clear from equations 1 and 2 that the resistivity of the surface decreases as $\mu_s$ the mobility increases and that the current would increase directly with an increase in surface mobility $\mu_s$. Therefore for a fixed geometry and voltages, the current $I_D$ can be increased without increased dissipation by increasing the surface mobility $\mu_s$. This increase in surface mobility reflects directly to increases in the "speed" of the MOSFET.

Figure 4:
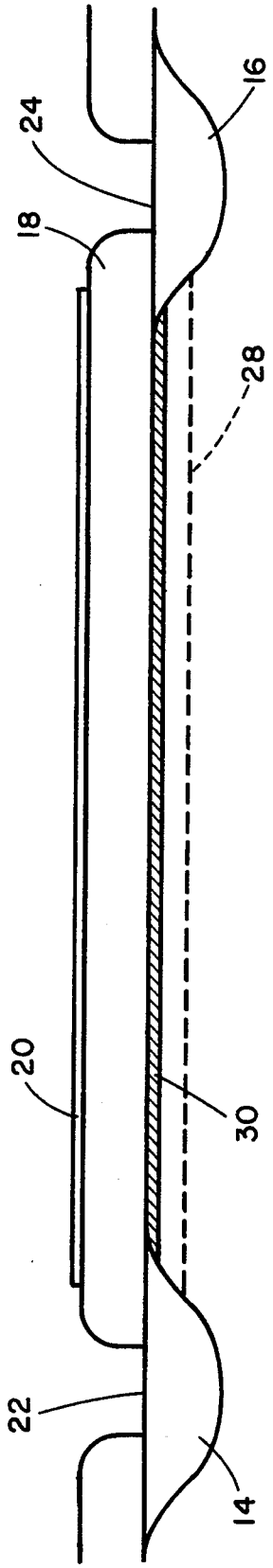
FIG. 4 is a cross-sectional schematic view of a silicon MOSFET with an undoped silicon layer positioned between the gate oxide and the p-doped silicon substrate.

FIG. 4 illustrates a device which is illustrative of this invention. The inversion layer 26 of the prior art MOSFET is located within and placed as a part of an intrinsic or undoped layer 30 of semiconductor material. The intrinsic layer 30 constitutes the channel for the inversion layer of the Enhanced Mobility MOSFET (EMMOSFET). The surface mobility $\mu_s$ is increased because; 1) there are no charged impurity atoms, thus there is little or no ionized impurity "scattering"; 2) there are essentially no electrically neutral impurity atoms which can cause scattering; and 3) the lattice temperature is less than prior art MOSFETS, that is the Joule heating is less thereby reducing the deflecting or "scattering" events which occur due to distortions of the crystal associated with thermal vibrations.

Figure 6:
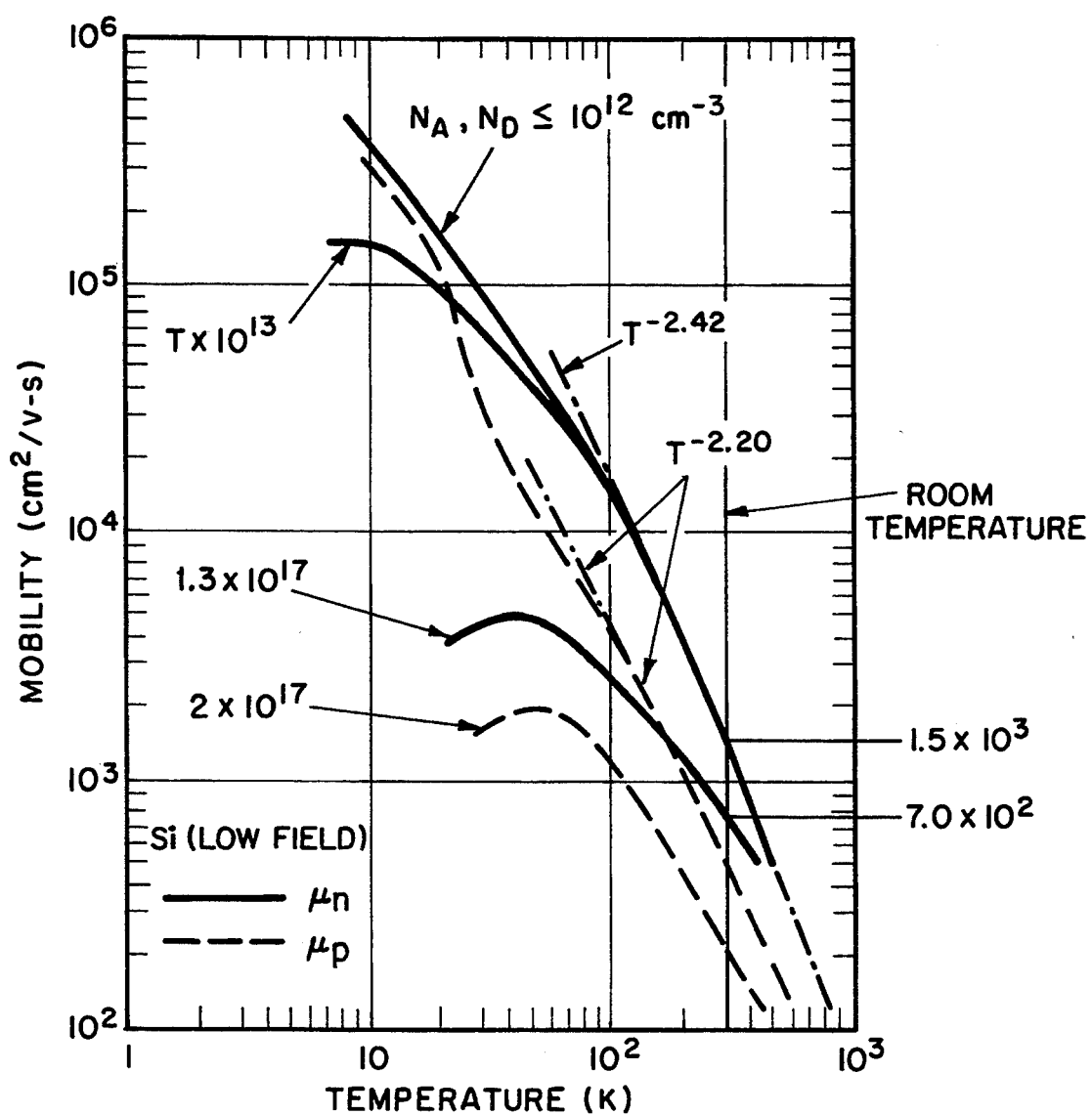
FIG. 6 is a graph showing the mobility of the electrons and holes in silicon as a function of temperature according to Jacobini C. et al, *Solid State Electron,* 20), 77 (1977).
Figure 7A:
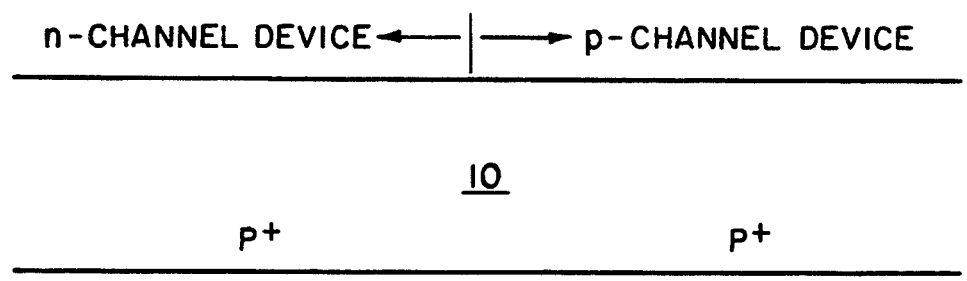
FIG. 7a–7d are a pictorial illustrations of the principal processing steps for both the n-channel and p-channel devices.
Figure 7B:
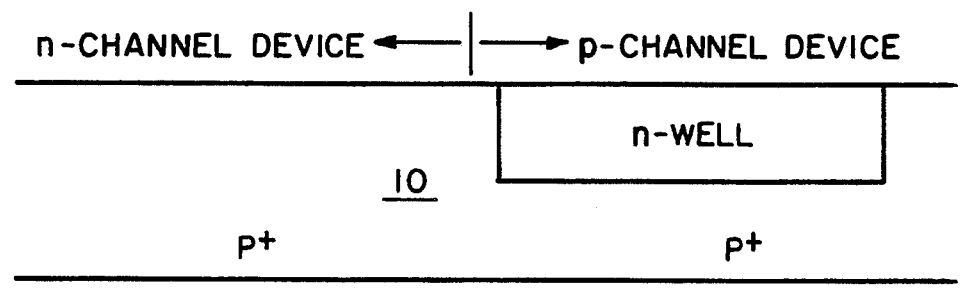
Figure 7C:
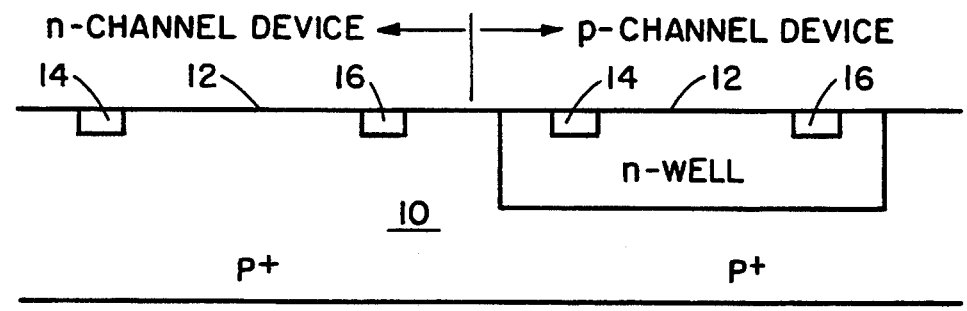
Figure 7D:
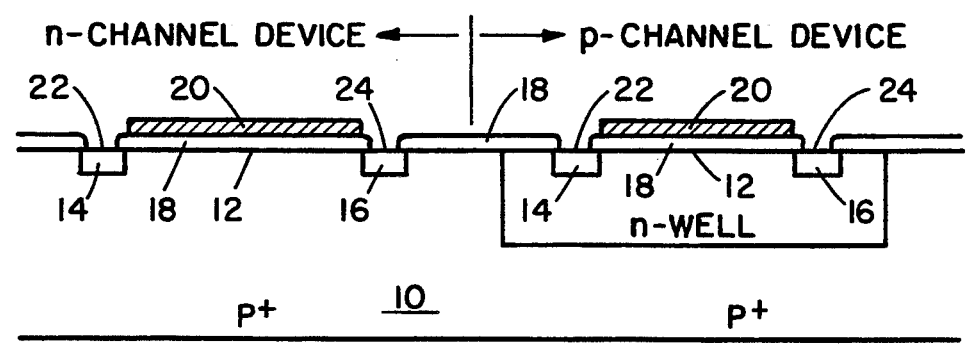

FIG. 6 illustrates the relationship of mobility measured in cm$^2$/volt-sec as a function of temperature T measured in degrees Kelvin (°K.) with the doping concentration $N_A$ or $N_D$ as the running parameter. With reference to FIG. 6 at about 300° K. a doping concentration decrease of from about $1.3 \times 10^{17}$cm$^{-3}$ to about $4.0 \times 10^{13}$cm$^{-3}$ causes the mobility to increase by a factor of about 2. In other words, the ratio of a mobility of about $1.5 \times 10^3$ to $7.0 \times 10^2$ is 2. Thus, at room temperature as the doping concentration increases, the mobility decreases. In terms of resistivity of the bulk material, where the resistivity is given by:

$$\rho = \frac{1}{ne\mu} \approx \frac{1}{N_D e\mu} \quad (3)$$

where n is the average carrier concentration which is approximately equal to $N_D$, the concentration of ionized impurities, e is the electronic charge and $\mu$ is the mobility; the increase in $N_D$ decreases $\mu$ according to FIG. 6. A decrease in $\mu$ alone would result in an increase in the resistivity $\rho$. Doping of bulk semiconductor is necessary in order to have enough charges to make devices usable. Within normal levels of doping, that is, levels of doping common within the semiconductor manufacturing industry, the increase of dopant level i.e., an increase in $N_D$ will result in decreases in resistivity though not as directly as would otherwise be expected. That is, even though $\mu$ is inversely dependent upon $N_D$, the product $N_D\mu$ will nevertheless increase.

While the consequences of doping level relative to mobility decreases are inescapable in bulk devices, for surface devices it is possible to collect the charge carriers from the bulk substrate 10 to the surface 12. In this way the charge concentration is increased without having to increase the level of doping and thus decreasing charge mobility.

Now if the volume under the surface 12 which constitutes the inversion layer 26 is replaced by an intrinsic or undoped layer 30 of semiconductor material having a thickness in excess of the thickness of the inversion layer 26, then even though the charge concentration has been significantly increased, the mobility $\mu_s$ will not be decreased. This result is due in large part to the lack of impurity atoms in the inversion layer region. Thus the electrons provided by the bulk doping are collected in the inversion layer 30 where there is no doping. The electrons are thus more free to move.

The enhanced mobility metal oxide semiconductor transistor or the EMMOSFET has been described. This invention also encompasses the methods for fabricating the EMMOSFET having the advantages earlier described.

FIGS. 7 is an illustration of the main fabrication steps of both the n and p channel devices. It is known to those who are familiar with the field of MOS devices how the basic processing or fabrication steps are carried out for both of the above-mentioned types of devices and the complimentary MOS devices which are combinations of the above two. The method of this invention includes the step of preparing substrate 10 by a process known as epitaxy or by ion implantation with a layer 30 as shown in FIG. 4 of intrinsic or undoped silicon. Preferably, this step is carried out prior to the step of shallow diffusing the source and drain regions 14 and 16. It should be noted that the epitaxy process, which is the preferred method, is well-known. The fabrication details such as how diffusion over epitaxy is made, or how photo-lithographic masks are used so that only source-drain areas are diffused is also well known and understood. It should further be noted that an intrinsic or pure layer can become internally doped by diffusion if the substrate 10 is heated for long periods of time. Therefore, once the pure layer 30 has been placed upon the doped substrate 10 the temperature of the substrate must be maintained below that temperature at which diffusion of the dopant from the doped substrate 10 into the pure layer 30 would take place. When this is not possible the pure layer must be prepared so that it initially has a thickness which, after all process steps are completed, will be between about 100 Å to about 1000 Å. An n-channel device will be used to illustrate the most preferred method for the fabrication of the EMMOSFET. As has been previously noted, variations of the process steps and addition thereto that are required in order to fabricate the p-channel and the C-MOS devices are well-known in the field and the preferred method described herein is applicable to such devices with minor modifications. It should be noted that numerals 18, 20, 22 and 24 of FIG. 7d are the oxide layer, the gate electrode, the source contact portion and the drain contact portion shown in the various figures and previously described herein.

To fabricate an n-channel MOSFET having an enhanced charge mobility an EMMOSFET, a bulk of pure silicon having an essentially planar surface and known as a silicon wafer is first impurity doped using boron as the dopant. The most preferred process to achieve the impurity doping is diffusion although ion implantation is also employed. However, often one can start with a wafer which is boron doped during the crystal growing process. The most preferred dopant density is from about $10^{16} cm^{-3}$ to about $10^{18} cm^{-3}$. The p-doped silicon substrate is covered with a layer 30 of intrinsic (undoped) silicon. The preferred method for depositing the intrinsic layer is by epitaxy; however, ion implantation is a technique which would also result in the deposition of the intrinsic layer upon the planar surface 12 of the undoped substrate 10. The thickness of the deposition layer of undoped silicon will vary with time and temperature because at elevated temperatures the dopant used in the underlying wafer will diffuse into the pure layer, decreasing its effective thickness.

The most preferred final thickness of the intrinsic layer would be from about 200 Å to about 350 Å. The preferred range thickness would be from about 150 Å to 500 Å. It should be noted that the semiconductor device fabricated having any final intrinsic layer thickness more than zero has an enhanced mobility and therefore a higher speed over the prior art devices not having the undoped layer. The final thickness of the intrinsic layer can be made anywhere from about 100 Å to about 1000 Å; however, about 230 Å is the optimal thickness.

The minimum thickness needed in order to achieve reasonable levels of performance increases is determined by the following factors. The inversion layer is typically 60-80 Å thick. The electrical scattering forces at the ionized impurities diminish with distance from the inversion layer. About 150 Å of distance is considered to be enough to make the forces essentially imperceptible. This means that from about 210 Å to about 230 Å would be the ideal thickness. Although one could make the thickness of the intrinsic layer much thicker than 230 Å, this would make the depletion depth between the inversion layer and the bulk p-silicon region very thick. This would be detrimental to the operation of the devices. Another important point to remember is that during the oxidation process which is used to deposit the silicon oxide insulator layer, a growth of thickness d of oxide results in a reduction of intrinsic silicon layer thickness equal to about 0.45d. Also during the hot fabrication steps such as oxidation and/or diffusion or drive-in, the density of the dopants in the doped substrate redistribute and would diffuse into the pure intrinsic layer. Thus the amount and depth of penetration of the redistributed dopant and the reduction of the intrinsic silicon layer thickness due to silicon dioxide growth must be calculated so that the original thickness of the pure layer has the extra allocation to accommodate the loss in thickness of the pure layer. At the conclusion of the fabrication process the thickness of the intrinsic layer should be within the desired range for the particular EMMOSFET being fabricated.

Empirical relationships describe, as a function of time t and temperature T, the characteristic distance of travel of many of the well known dopants in silicon. Therefore, for a particular fabrication process protocol, all elevated temperature levels, the time duration for each of the steps of fabrication, and the gate oxide thickness will permit one skilled in the art to compute the intrinsic layer thickness to be initially deposited in order to have an EMMOSFET with the desired final thickness of the pure silicon layer.

Source and drain regions are created on predetermined locations on the planar surface of the p-doped substrate. Well known photoresist techniques are useful in causing the selected locations to be shallow diffused creating the n-doped source and drain regions. The methods of selective shallow diffusion are well known in the art. The most common spacing between the source and drain regions is of the order of a micrometer. The space between the source and drain constitutes, under proper applied voltage conditions, a path for electron flow. This path is the volume or layer which would otherwise be known as the inversion layer.

Although specific embodiments of the invention have been disclosed and discussed, it will be understood that other applications of the invention are possible and that the embodiments disclosed may be subject to changes, modifications and substitutions without departing from the spirit or scope of this invention.

What I claim is:

1. A semiconductor device comprising:
   a bulk of semiconductor material, having a predetermined concentration of impurity atoms selected from the group consisting of donors and acceptors, and having a substantially planar surface thereon and spaced apart source and drain regions embedded therein at said planar surface, said source and drain regions having a predetermined concentration of impurity atoms consisting of the impurity atoms in said Bulk of semiconductor material and the source and drain regions spaced one from the other defining a channel, of about 2.0 micrometers to 3.5 micrometers length, therebetween having a planar surface thereon;
   A layer of substantially undoped semiconductor material contiguous with said channel and deposited on said channel planar surface with said layer of undoped semiconductor material having a thickness of about 100A to about 500A said bulk semiconductor material and said undoped semiconductor material being made of silicon;
   an electrically insulating layer contiguous with said undoped layer and deposited thereon, and at most a portion of said electrically insulating layer contiguous with and deposited on said source and drain regions; and
   an electrical charge conduction layer deposited on said electrically insulating layer and electrically separate from said source and drain regions.

2. A semiconductor device as claimed in claim 1 wherein said layer of undoped semiconductor material has a thickness of about 150 Å to about 500 Å.

3. A semiconductor device as claimed in claim 2 wherein said layer of undoped semiconductor material has a thickness of about 200 Å to about 350 Å.

4. A semiconductor device comprising:
   a bulk of doped silicon semiconductor material, having spaced apart source and drain regions embedded therein and doped oppositely from said bulk of doped semiconductor material, said source and drain regions being spaced one from the other to define a channel, of about 2.0 micrometers to 3.5 micrometers length, therebetween; and
   a layer from about 100A to 500A of substantially undoped silicon semiconductor material disposed over and contiguous with said channel.

5. In an improved metal oxide semiconductor device comprising a bulk of semiconductor material, having a predetermined concentration of impurity atoms selected from the group consisting of donors and acceptors, and having a substantially planar surface thereon and spaced apart source and drain regions embedded therein at said surface, said source and drain regions having a predetermined concentration of impurity atoms different from the type selected for the predetermined concentration of impurity atoms in the bulk semiconductor material and the source and drain regions spaced one from the other defining a channel, of about 2.0 micrometers to 3.5 micrometers length, therebetween said improvement comprising;

A layer of substantially undoped semiconductor material deposited upon and contiguous with said planar surface of said channel, said layer of undoped semiconductor material having a final thickness after all processing steps from about 100A to about 500A, said bulk semiconductor material and said undoped semiconductor layer being made of silicon;

an electrically insulating layer contiguous and deposited on said undoped layer, said electrically insulating layer being contiguous with and deposited on less than the entire adjacent surface of said source and drain regions; and an electrical charge conduction layer contiguous with and deposited on said electrically insulating layer, said conduction layer being electrically separate from said source and drain regions.

6. A semiconductor device having enhanced charge mobility, comprising a bulk of semiconductor substrate material having predetermined concentration of impurity ions selected from the group consisting of donors and acceptors, and having a planar surface thereon and spaced apart source and drain regions embedded therein at said planar surface, said source and drain regions having a predetermined concentration of impurity atoms comprising impurity atoms different from the predetermined concentration of impurity atoms in said bulk of semiconductor material and the source and drain regions spaced one from the other defining a channel, of about 2.0 micrometers to 3.5 micrometers length, therebetween having a planar surface thereon said semiconductor device produced by the process comprising the steps of:

depositing a layer of undoped semiconductor material over said planar surface of said bulk semiconductor substrate material, said undoped layer having a thickness in the range from about 100A to about 500A, said bulk semiconductor material and said undoped layer having substantially identical compositions;

creating said source and drain regions embedded in said substrate at said planar surface thereby forming said channel regions between said source and drain regions;

depositing an electrically insulating layer over said source and drain regions, and on said undoped layer;

selectively removing said insulating layer from predetermined areas of said source and drain regions to expose at least a portion of said source and drain regions depositing and electrically conductive layer continuous with and on said electrically insulating layer and electrically separate from said source and drain regions; and selectively removing said electrically conductive layer from predetermined areas thereby creating said gate and creating a surface over said gate, source, and drain regions to which electrical conductor may be attached.

7. A semiconductor device as claimed in claim 5 wherein said layer of unduped semiconductor material has a thickness of about 150 Å to about 500 Å.

8. A semiconductor device as claimed in claim 5 wherein said layer of undoped semiconductor material has a thickness of about 200 Å to about 350 Å.

* * * * *